United States Patent
Drake et al.

(10) Patent No.: US 8,941,426 B1
(45) Date of Patent: Jan. 27, 2015

(54) EXTENDING A CLOCK FREQUENCY RANGE OF A CRITICAL PATH MONITOR

(71) Applicant: International Business Machines Corporation, Armonk, NY (US)

(72) Inventors: Alan James Drake, Austin, TX (US); Michael Stephen Floyd, Cedar Park, TX (US); Pawel Owczarczyk, Highland, NY (US); Gregory Scott Still, Raleigh, NC (US); Marshall Dale Tiner, Austin, TX (US); Xiaobin Yuan, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/093,734

(22) Filed: Dec. 2, 2013

(51) Int. Cl.
*H03K 3/02* (2006.01)
*H03K 3/01* (2006.01)

(52) U.S. Cl.
CPC .................................... *H03K 3/01* (2013.01)
USPC ..... 327/198; 327/199; 324/750.3; 324/76.54; 716/113

(58) Field of Classification Search
USPC ................. 327/115, 116, 117, 118, 161, 185, 327/198–203, 208–218, 355–360; 377/47, 377/48
See application file for complete search history.

(56) References Cited

U.S. PATENT DOCUMENTS

| | | | |
|---|---|---|---|
| 6,228,160 B1 * | 5/2001 | Hanich et al. | 106/456 |
| 6,628,160 B2 | 9/2003 | Lin et al. | |
| 7,576,569 B2 * | 8/2009 | Carpenter et al. | 327/14 |
| 7,900,165 B2 * | 3/2011 | Oh et al. | 716/136 |
| 8,405,413 B2 * | 3/2013 | Carpenter et al. | 324/750.3 |
| 2011/0095803 A1 * | 4/2011 | Meijer et al. | 327/291 |
| 2012/0043982 A1 * | 2/2012 | Carpenter et al. | 324/750.3 |
| 2013/0117589 A1 * | 5/2013 | Satyamoorthy et al. | 713/320 |

* cited by examiner

*Primary Examiner* — Brandon S Cole
(74) *Attorney, Agent, or Firm* — Garg Law Firm, PLLC; Rakesh Garg; William J. Stock (57) ABSTRACT

A critical path monitor (CPM) is configured in an integrated circuit (IC). The IC includes a set of critical paths. The CPM includes a set of split paths, a split path in the set of split paths corresponding to a critical path in the set of critical paths, and a split path in the set of split paths including an edge detector. The edge detector is configured with a set of edge detector latches. A set of set-reset (SR) latches is configured such that an edge detector latch is associated with a corresponding SR latch. A reset signal is configured to reach the set of edge detector latches in an offset synchronization with a latch clock signal used in the set of edge detector latches. The CPM is configured to operate using a frequency of the latch clock signal such that the frequency is higher than a threshold frequency.

15 Claims, 8 Drawing Sheets

EXTENDING A CLOCK FREQUENCY RANGE OF A CRITICAL PATH MONITOR

TECHNICAL FIELD

The present invention relates generally to a method, system, and computer program product for calibrating the operating conditions of a processor using a critical path monitor. More particularly, the present invention relates to a method, system, and computer program product for extending a clock frequency range of a critical path monitor.

BACKGROUND

Integrated circuits (ICs) are used for performing various types of operations, such as executing instructions, performing computations, storing data, and moving data. A microprocessor, or processor, is a type of integrated circuit that is commonly used in modern-day computers for performing a variety of operations, such as arithmetic, logical, and data movement operations. A processor can include one or more cores. A core in a processor is the circuitry that performs the processor's functions. Within this disclosure, the terms processor and core are used interchangeably.

The operation of an IC depends on many operating conditions, including but not limited to the voltage, frequency, temperature, type of workload, and age of the circuit. A change in one or more of the operating conditions, such as a change in the voltage, noise in the electrical environment of the IC, and other reasons can cause timing variations within an IC.

When a process uses an IC, the process uses a subset of components arranged as a part of the IC. The subset of components arranged in a particular order as used by the process is called a path. As an example, a core can include thousands if not millions of paths through the core circuitry.

A path has an associated delay. The delay is the timing delay introduced in a signal as the signal traverses the path. A critical path is a path, which when operated at above a threshold level of an operating condition, can cause the IC to fail. For example, a path may be a critical path if using the path at a higher than a threshold frequency causes the delay in the path to exceed an acceptable delay threshold. Different paths may be sensitive to different operating conditions, or different combinations of operating conditions, making those paths critical for those operating conditions.

A critical path monitor (CPM) is a monitoring circuit configured to monitor the delay in one or more critical paths. Generally, a CPM simulates the one or more critical paths and provides information regarding the critical path delay by subjecting the simulated paths to operating conditions similar to the operating conditions experienced by the critical path in the IC.

An IC usually has a control component, which controls an operating condition of an IC. For example, a clock provides the operating frequency, and can be adjusted for changing the operating frequency of the IC. A voltage regulator similarly regulates the voltage at which the IC or a part thereof operates.

A feedback loop between a CPM and a control component allows a control component to adjust the corresponding operating condition based on CPM calibrations. A calibration is the process of altering a value or a characteristic of a simulated path in the CPM. Typically, the calibration adjusts the delay of a simulated path in the CPM to achieve an acceptable delay in the simulated path. The calibration adjustment in turn informs a control component about an amount of adjustment needed in the operating condition to achieve a similarly desirable delay in the critical path in the IC.

SUMMARY

The illustrative embodiments provide a method, system, and computer program product for extending a clock frequency range of a critical path monitor. An embodiment An embodiment includes a method for extending a clock frequency range of a critical path monitor (CPM). The embodiment configures, in an integrated circuit (IC), the CPM, wherein the IC includes a set of critical paths, wherein the CPM includes a set of split paths, a split path in the set of split paths corresponding to a critical path in the set of critical paths, and a split path in the set of split paths including an edge detector. The embodiment configures the edge detector with a set of edge detector latches. The embodiment configures a set of set-reset (SR) latches, wherein an edge detector latch in the set of edge detector latches is associated with a corresponding SR latch in the set of SR latches. The embodiment configures a reset signal to reach the set of edge detector latches in an offset synchronization with a latch clock signal used in the set of edge detector latches. The embodiment configures the CPM to operate using a frequency of the latch clock signal such that the frequency is higher than a threshold frequency.

Another embodiment includes a computer usable program product comprising a computer usable storage device including computer usable code for extending a clock frequency range of a critical path monitor (CPM). The embodiment further includes computer usable code for configuring, in an integrated circuit (IC), the CPM, wherein the IC includes a set of critical paths, wherein the CPM includes a set of split paths, a split path in the set of split paths corresponding to a critical path in the set of critical paths, and a split path in the set of split paths including an edge detector. The embodiment further includes computer usable code for configuring the edge detector with a set of edge detector latches. The embodiment further includes computer usable code for configuring a set of set-reset (SR) latches, wherein an edge detector latch in the set of edge detector latches is associated with a corresponding SR latch in the set of SR latches. The embodiment further includes computer usable code for configuring a reset signal to reach the set of edge detector latches in an offset synchronization with a latch clock signal used in the set of edge detector latches. The embodiment further includes computer usable code for configuring the CPM to operate using a frequency of the latch clock signal such that the frequency is higher than a threshold frequency.

Another embodiment includes an apparatus for extending a clock frequency range of a critical path monitor (CPM). The embodiment further includes the CPM in an integrated circuit (IC), wherein the IC includes a set of critical paths, wherein the CPM includes a set of split paths, a split path in the set of split paths corresponding to a critical path in the set of critical paths, and a split path in the set of split paths including an edge detector. The embodiment further includes the edge detector with a set of edge detector latches. The embodiment further includes a set of set-reset (SR) latches, wherein an edge detector latch in the set of edge detector latches is associated with a corresponding SR latch in the set of SR latches. The embodiment further includes a signal generator to send a reset signal such that the reset signal reaches the set of edge detector latches in an offset synchronization with a latch clock signal used in the set of edge detector latches, and wherein the CPM is configured to operate using a frequency of the latch clock signal such that the frequency is higher than a threshold frequency.

Another embodiment includes a method for extending a clock frequency range of a critical path monitor (CPM). The embodiment configures, in an integrated circuit (IC), the CPM, wherein the IC includes a set of critical paths, wherein the CPM includes a set of split paths, a split path in the set of split paths corresponding to a critical path in the set of critical paths, and a split path in the set of split paths including an edge detector. The embodiment configures the edge detector with a set of edge detector latches. The embodiment configures sending a signal through the split path, wherein the signal is delayed by a first amount of time in a first portion of the split path, wherein the signal is further delayed reaching each edge detector latch in the set of edge detector latches by a different second amount of time. The embodiment configures each edge detector latch in the set of edge detector latches to capture the signal when a rising edge of the signal arrives at the edge detector latch. The embodiment configures each edge detector latch in the set of edge detector latches to reset when a falling edge of the signal arrives at the edge detector latch

BRIEF DESCRIPTION OF THE SEVERAL VIEWS OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

The illustrative embodiments recognize that presently used CPMs suffer from certain undesirable traits that prevent achieving optimum operating conditions in an IC. The illustrative embodiments recognize that presently, a circuit used to latch a delayed clock signal in a simulated path limits the range of clock frequencies that can be used to calibrate the CPM.

The illustrative embodiments used to describe the invention generally address and solve the above-described problems and other problems related to calibrating a CPM. The illustrative embodiments provide a method, system, and computer program product for extending a clock frequency range of a critical path monitor.

A simulated path in a modified or improved CPM, implementing an edge detector in conjunction with one or more simulated paths according to an embodiment, is referred to as a split path within this disclosure. The edge detector component of a split path captures the clock pulse when the pulse arrives after a delay through the simulated path component of the split path.

The illustrative embodiments recognize that the capturing or latching of the delayed clock edge becomes problematic in the presently used edge detection circuit when the clock frequency exceeds a presently designated maximum frequency. The illustrative embodiments also recognize that attempts to eliminate any minimum frequency limit cause a presently used edge detection circuit to become overly complex and impractical for implementation. The range of frequencies between the presently designated maximum and minimum frequencies forms the present frequency range. An embodiment described herein simplifies an edge detection circuit for the present frequency range. Another embodiment described herein allows a modified edge detection circuit to operate below the presently designated minimum frequency with reliable edge capture. Another embodiment described herein allows a modified edge detection circuit to operate above the presently designated maximum frequency with reliable edge capture.

The illustrative embodiments are described with respect to certain integrated circuits, components, data processing systems, environments, components, and applications only as examples. Any specific manifestations of such artifacts are not intended to be limiting to the invention. Any suitable manifestation of these and other similar artifacts can be selected within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. An illustrative embodiment may be implemented in hardware, software, or a combination thereof.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 1:
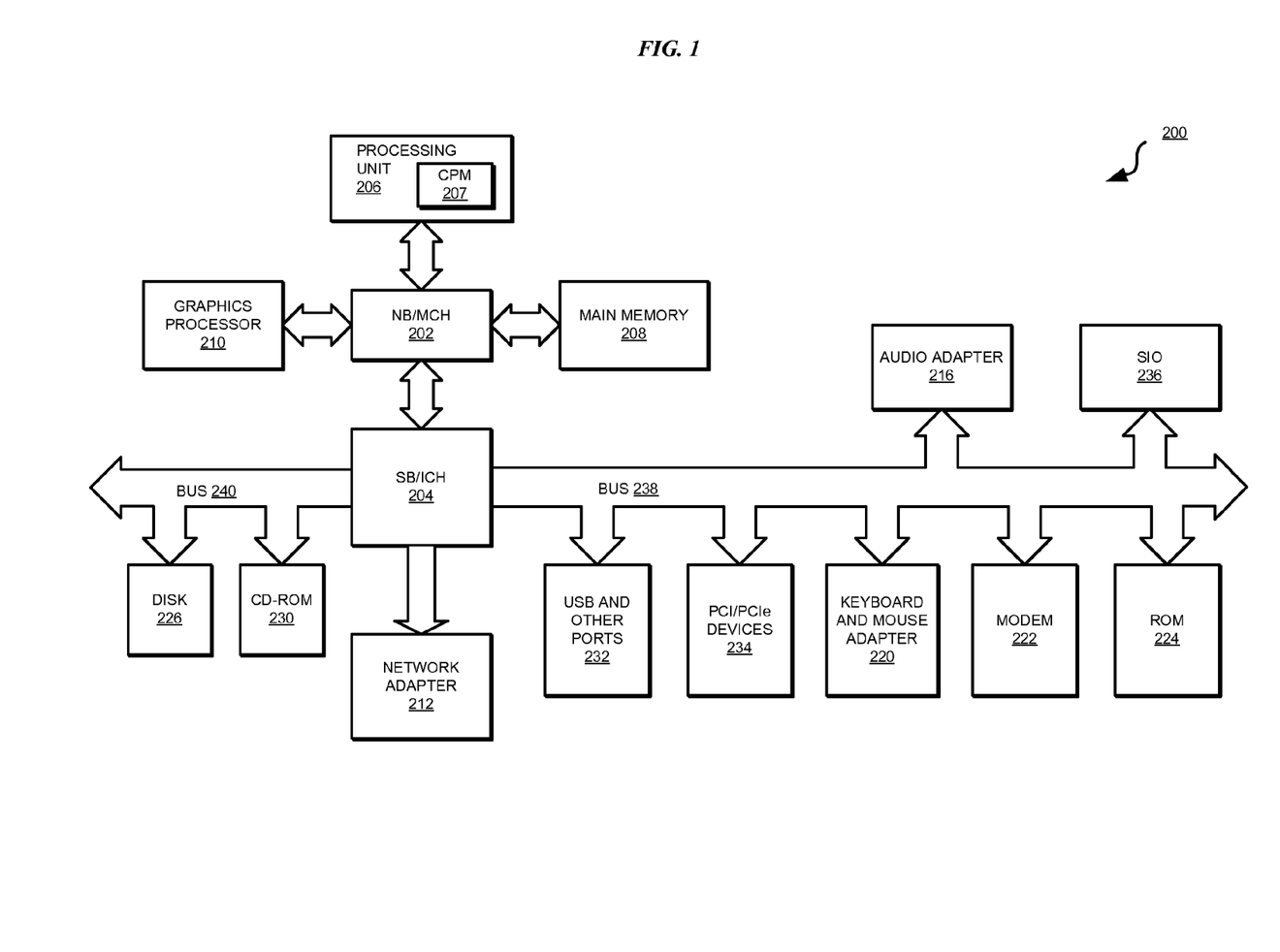
FIG. 1 is an example diagram of a data processing environment in which illustrative embodiments may be implemented.

With reference to the figures and in particular with reference to FIG. 1, this figure is an example diagram of a data processing environment in which illustrative embodiments may be implemented. FIG. 1 is only an example and is not intended to assert or imply any limitation with regard to the environments in which different embodiments may be implemented. A particular implementation may make many modifications to the depicted environments based on the following description.

With reference to FIG. 1, this figure depicts a block diagram of a data processing system in which illustrative embodiments may be implemented. Data processing system 200 is an example of a computer or another type of device in which computer usable program code or instructions implementing the processes may be located for the illustrative embodiments.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. CPM 207 in processing unit 206 may be one or more CPMs in which an embodiment is implemented. CPM 207 is depicted in processing unit 206 only as an example without implying a limitation thereto. CPM 207 can be implemented in other IC's such as in graphics processor 210 or memory 208. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro-SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. The operating system may be a commercially available operating system such as AIX® (AIX is a trademark of International Business Machines Corporation in the United States and other countries), Microsoft® Windows® (Microsoft and Windows are trademarks of Microsoft Corporation in the United States and other countries), or Linux® (Linux is a trademark of Linus Torvalds in the United States and other countries). An object oriented programming system, such as the Java™ programming system, may run in conjunction with the operating system and provides calls to the operating system from Java™ programs or applications executing on data processing system 200 (Java and all Java-based trademarks and logos are trademarks or registered trademarks of Oracle Corporation and/or its affiliates).

Instructions for the operating system, the object-oriented programming system, and applications or programs, such as the instructions to execute a process according to an embodiment described herein, are located on storage devices, such as hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

The hardware in FIG. 1 may vary depending on the implementation. Other internal hardware or peripheral devices, such as flash memory, equivalent non-volatile memory, or optical disk drives and the like, may be used in addition to or in place of the hardware depicted in FIG. 1. In addition, the processes of the illustrative embodiments may be applied to a multiprocessor data processing system.

In some illustrative examples, data processing system 200 may be a personal digital assistant (PDA) or another mobile computing device, which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIG. 1 and above-described examples are not meant to imply architectural limitations. For example, data processing system 200 also may be a tablet computer, laptop computer, or telephone device in addition to taking the form of a PDA.

Figure 2:
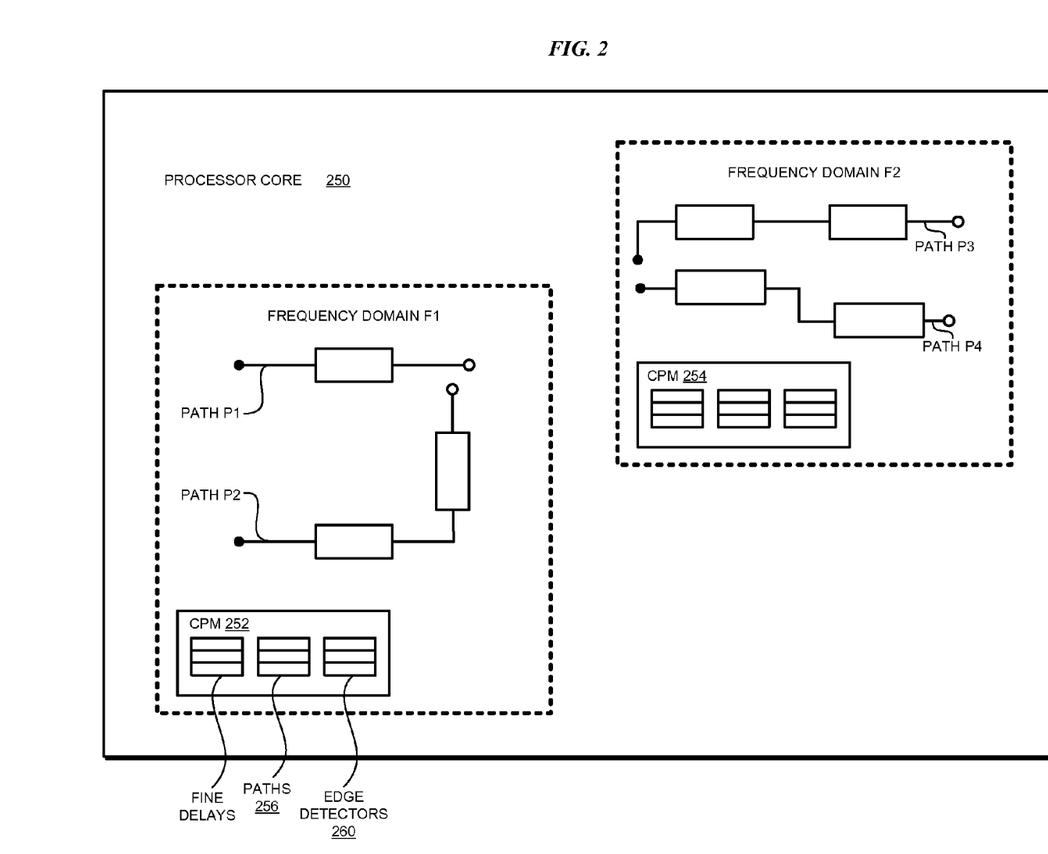
FIG. 2 depicts a block diagram of an overview of a CPM configuration in accordance with an illustrative embodiment.

With reference to FIG. 2, this figure depicts a block diagram of an overview of a CPM configuration in accordance with an illustrative embodiment. Processor core 250 is an example of processing unit 206 in FIG. 1. Applicability of an embodiment is depicted and described with respect to a processor core, such as processor core 250, only as an example and without implying a limitation thereto.

A frequency domain is an area of an IC, such as an area of core 250, that operate at a certain operating frequency. For example, under certain circumstances, frequency domain F1 may be operating at the clock frequency and frequency domain F2 may be operating at half the clock frequency.

Paths P1 and P2 are two examples of many critical paths in frequency domain F1. Similarly, paths P3 and P4 are two examples of many critical paths in frequency domain F2.

CPM 252 and 254 are each improved CPMs that implement an embodiment described herein. CPM 252 simulates the delays of paths P1 and P2, and any number of other critical paths. CPM 252 is located proximate to paths P1 and P2 on the die of core 250 such that the split paths in CPM 252 experience similar operating conditions as paths P1 and P2. CPM 254 simulates the delays of paths P3 and P4, and any number of other critical paths. CPM 254 is located proximate to paths P3 and P4 on the die of core 250 such that the split paths in CPM 254 experience similar operating conditions as paths P3 and P4.

Improved CPM 252 includes split paths 256 according to an embodiment. Improved CPM 252 includes edge detectors 260, such that one edge detector in edge detectors 260 corresponds to one split path in split paths 256. CPM 254 includes split paths and edge detectors in a similar manner.

Figure 3:
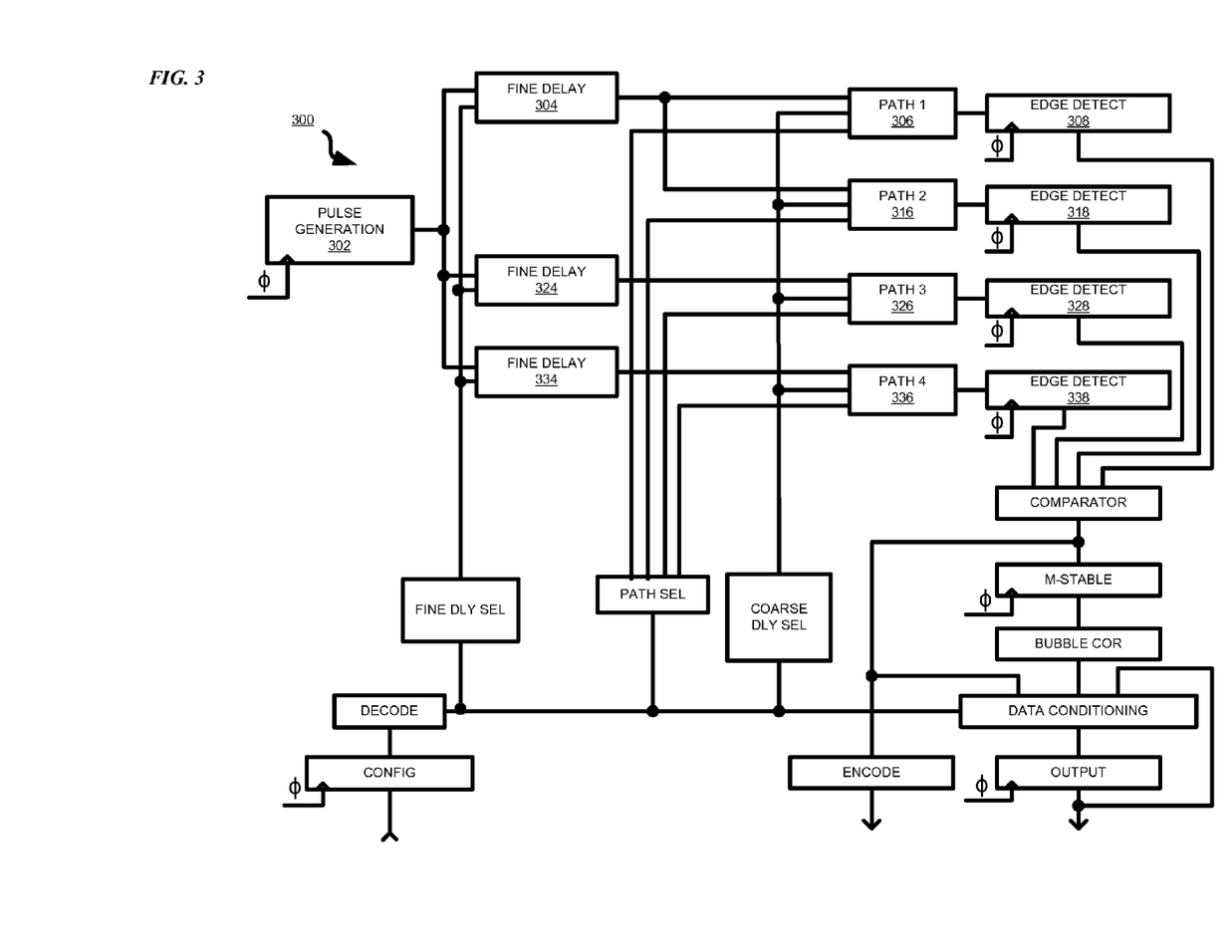
FIG. 3 depicts an example schematic CPM configuration in accordance with an illustrative embodiment.

With reference to FIG. 3, this figure depicts an example schematic CPM configuration in accordance with an illustrative embodiment. Configuration 300 can be implemented in CPM 252 in FIG. 2.

Pulse generation component 302 generates a clock pulse at a certain frequency. The pulse passes through one or more split paths in configuration 300 to reach the edge detectors in those split paths. The time at which an edge detector in a split path detects the edge of the pulse corresponds to the delay in that split path. The total delay of a split path is similar to the total delay of the critical path in the IC that the split path simulates. Furthermore, a sensitivity of the delay, such as to a changing operating condition, of a split path is similar, such as within a threshold tolerance limit, to a sensitivity of the delay of corresponding critical path to the changing operating condition.

Only as an example and without implying any limitation thereto, configuration 300 depicts four example split paths. For example, a first split path includes fine delay section 304, simulated path 306 labeled "Path 1," and edge detector 308. A second split path shares fine delay section 304, and includes simulated path 316 labeled "Path 2" and edge detector 318. A third split path includes fine delay section 324, simulated path 306 labeled "Path 3," and edge detector 328. A fourth split path includes fine delay section 334, simulated path 306 labeled "Path 4," and edge detector 338.

Figure 4:
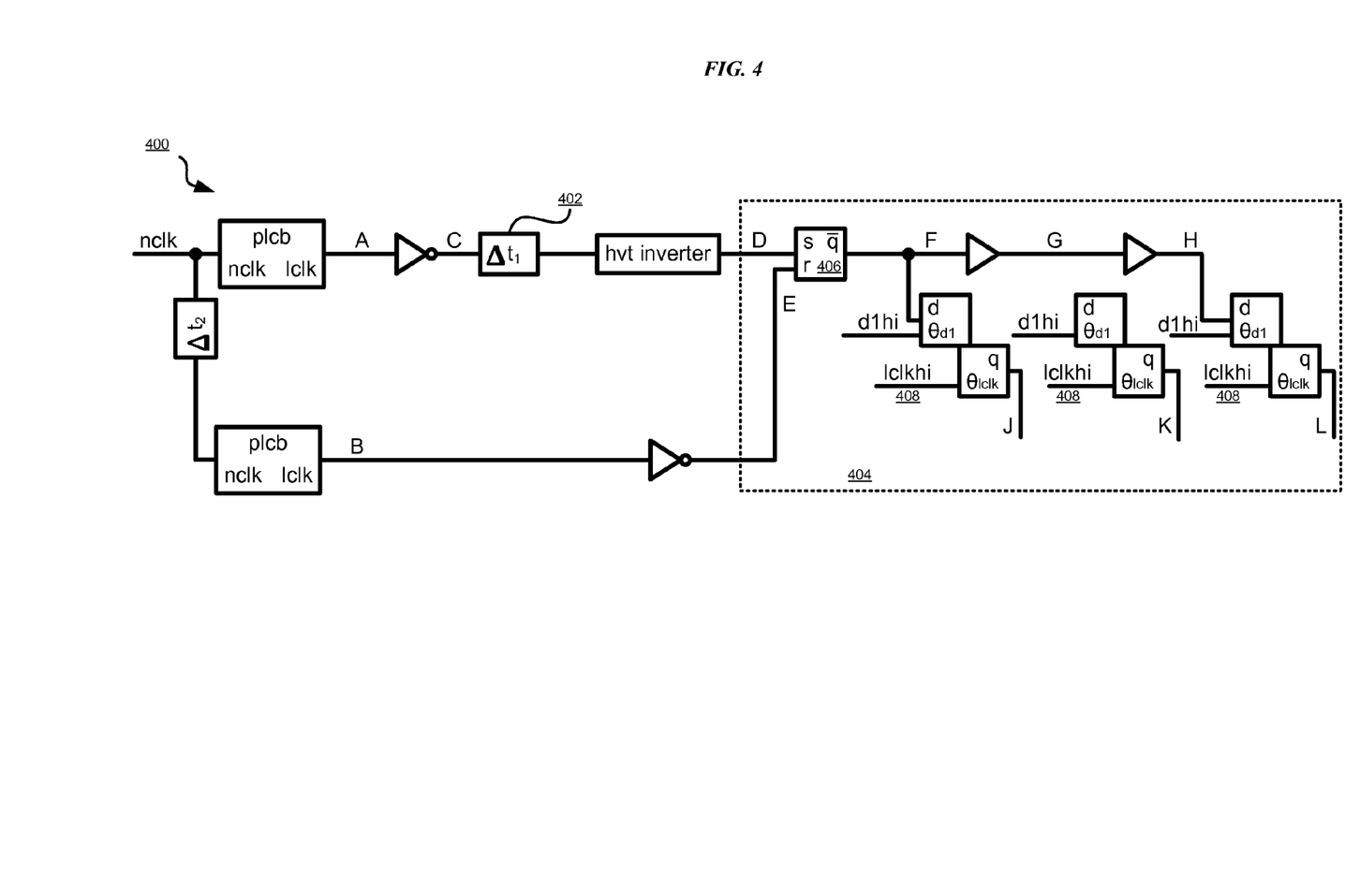
FIG. 4 depicts a circuit diagram of a presently used edge detector, which can be improved using an illustrative embodiment.

With reference to FIG. 4, this figure depicts a circuit diagram of a presently used edge detector, which can be improved using an illustrative embodiment. Presently used edge detector circuit 400, and improvements there upon as described in FIGS. 5 and 6, can be used as any of edge detectors 308, 318, 328, and 338 in FIG. 3.

Circuit 400 comprises simulated path delay 402 and edge detector 404. In circuit 400, the signal to be captured for delay calibration begins at point A, passes through point C, to point D. At point D the delayed signal sets a set-reset latch, SR Latch 406. SR latch 406 passes the rising edge of the signal to points F, G, and H, where edge detection latches J, K, and L, respectively, latch or capture the edge of the delayed signal when a latch clock signal goes high (lclkhi signal 408).

Reset signal E at SR latch 406 expressly resets SR latch 406. SR latch 406 is used with reset signal E so that latches J, K, and L do not erroneously capture the falling edge of signal D if the clock signal lclkhi is delayed, resulting in unintended or erroneous data. Timing-wise, signal D arrives at points F, G, and H when signal 408 goes high at latches J, K, and L. After signal 408 goes low, reset signal E arrives at points F, G, and H.

The frequency of reset signal E corresponds to the frequency of the signal at point A. Therefore, when the frequency is reduced up to a present minimum frequency, the reset signal, not the falling edge of set signal D, resets the edge detection latches J, K, and L.

The illustrative embodiments recognize that this design suffers from a drawback that there is a present maximum frequency at which circuit 400 can operate. Imagine that the lclk signal 408 has gone low and reset signal E has started propagating to points F, G, and H. The reset signal arrives at point F after a first delay, at point G after a greater second delay, and at point H after a still greater delay. The next lclk signal 408 high should not occur at least for some time after the time latch L is reset. If lclk frequency in increased, the next lclk high can occur at latch L before latch L is reset from the previous reading. Consequently, the reset at latch L can overlap with the rising edge of the next lclk signal 408, the falling edge of lclk signal 408, or somewhere in between.

This timing condition poses a limit on how high the lclk frequency can get, that limit acting as the present maximum frequency of circuit 400. That limit has to be such that there is some finite lag on the rising edge of the next lclk signal at latch L, from the time reset signal E propagates to point H. In other words, the timing of the reset signal clearing the last edge detector latch has to be faster than the frequency with which circuit 400 can sample.

Circuit 400 can be operated to sample a signal down to a very low frequency. Circuit 400 takes a sample every clock cycle by setting and resetting SR latch 406 every clock cycle. The placement of SR latch 406 as shown determines what the frequency range for circuit 400 can be. In other words, the distance and the corresponding delay between the reset applied at SR latch 406 and when the reset clears the last edge detector latch bounds the maximum lclk frequency of circuit 400.

The illustrative embodiments recognize that the delay in propagating the reset signal from point F to point H can be significant compared to the lclk signal width. It is not uncommon for this reset propagation delay to be one fourth or even one third of the lclk signal width. Each of points F, G, and H represents a stage, and each stage generates one bit in the delay measurement. Presently, up to twelve stages are in use to give a twelve bit resolution of the delay measurement.

The illustrative embodiments recognize that higher resolution of delay measurement corresponds to greater number of stages. However, increasing the number of stages increases the propagation delay in reset signal E, and consequently reduces the maximum frequency at which circuit 400 can operate. Therefore, circuit 400 has to be modified such that number of stages and the corresponding propagation delay of reset signal E do not adversely affect the maximum sampling frequency.

The illustrative embodiments further recognize that for this placement of SR latch 406 as shown in circuit 400, each SR latch 406 in a CPM design has to be formed of similar components. The illustrative embodiments recognize that the components that form each simulated path in a given CPM should match with the components of the actual corresponding delay circuit in the processor in their response to the operating environment. A restriction on the type of components that can be used to form the SR latch, such as SR latch 406 positioned as in circuit 400, forces a simulated path to operate with components of SR latch 406, which may exhibit different responses to the operating conditions of the actual delay path than the components of the actual delay path.

Figure 5:
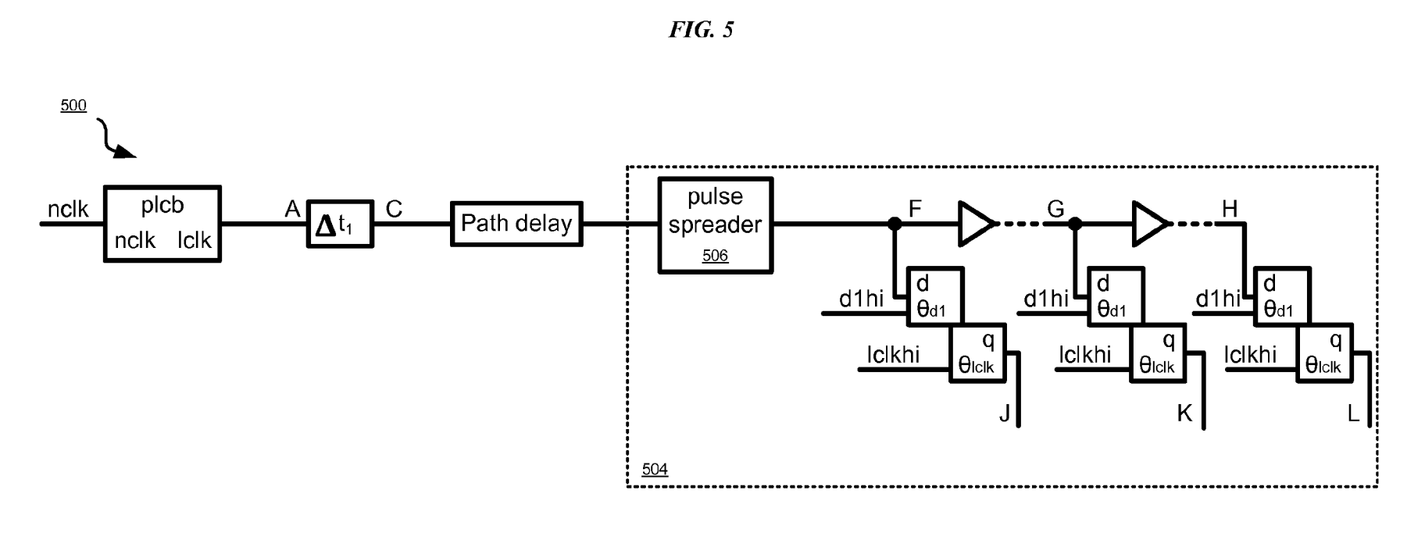
FIG. 5 depicts a circuit diagram of one example configuration to increase the maximum sampling frequency and simplify the timing and area impact of a CPM in accordance with an illustrative embodiment.

With reference to FIG. 5, this figure depicts a circuit diagram of one example configuration to increase the maximum sampling frequency of a CPM in accordance with an illustrative embodiment. Circuit 504 replaces circuit 404 to improve a CPM's clock frequency.

Delayed clock signal arrives through path delay component 502, which simulates the actual delay in the actual critical path being monitored. Notice that SR latch 406 is no longer present in circuit 504. By removing the SR latch, and an express reset signal—reset signal E in FIG. 4, circuit 504 allows the falling edge of the delayed signal to propagate through the edge detection stages F, G, and H.

Configured in this manner, the falling edge of the delayed signal through the simulated path does the job of reset signal E of FIG. 4, and resets a latch in an edge detector stage as and when the falling edge clears that stage. Operating in this manner, the restrictive present maximum frequency limitation of circuit 400 is removed, and circuit 500 can operate at a higher frequency than the present maximum frequency of circuit 400.

However, because the falling edge of the delayed signal is responsible for resetting the edge detector latch, the latch clock frequency cannot be too low either. For example, if the lclk frequency is so low that the delayed signal's rising edge and falling edge both clear an edge detector latch before the lclk signal's falling edge, the edge detector latch will have been reset before the delayed signal is latched. Thus, the edge detector stage will lose the delayed signal's data if the lclk signal is slow to allow the rising and falling edges of the delayed signal to pass in the same lclk signal.

Thus, circuit 500 increases the maximum clock frequency at which the CPM can sample delay measurements. However, circuit 500 also increases the minimum frequency of sampling in the CPM. The trade-off between higher maximum frequency and higher minimum frequency may be acceptable in some implementations due to the simplified design of circuit 504.

The trade-off may be further desirable in some implementations because the unwanted components of the SR latch exhibiting dissimilar characteristics in response to operating environment changes, as compared to the characteristics of a simulated path components, are also avoided in circuit 500. The absence of the SR latch and its dissimilar components yields design simplification, cost reduction, higher accuracy critical path modeling, and better sensitivity of the simulated paths to the operating environment changes.

Circuit 500 is particularly useful in those circuit designs where a feedback circuit prevents the sampling frequency from falling below a threshold anyway. In such circuits, the risk of operating the circuit below threshold minimum sampling frequency is already removed, and that removal also reduces the risk of data loss due to operating the circuit below threshold minimum sampling frequency.

Pulse spreader 506 allows the time between the rising and falling edges of the delayed signal to be increased. By increasing the timing between the rising and the falling edges, i.e., by spreading the delayed signal, the lclk frequencies can be lowered below other otherwise higher minimum frequency as described above. A pulse spreader may not be required if the width of the pulse generated by pulse generation circuit 400 is acceptable in a given implementation.

Figure 6:
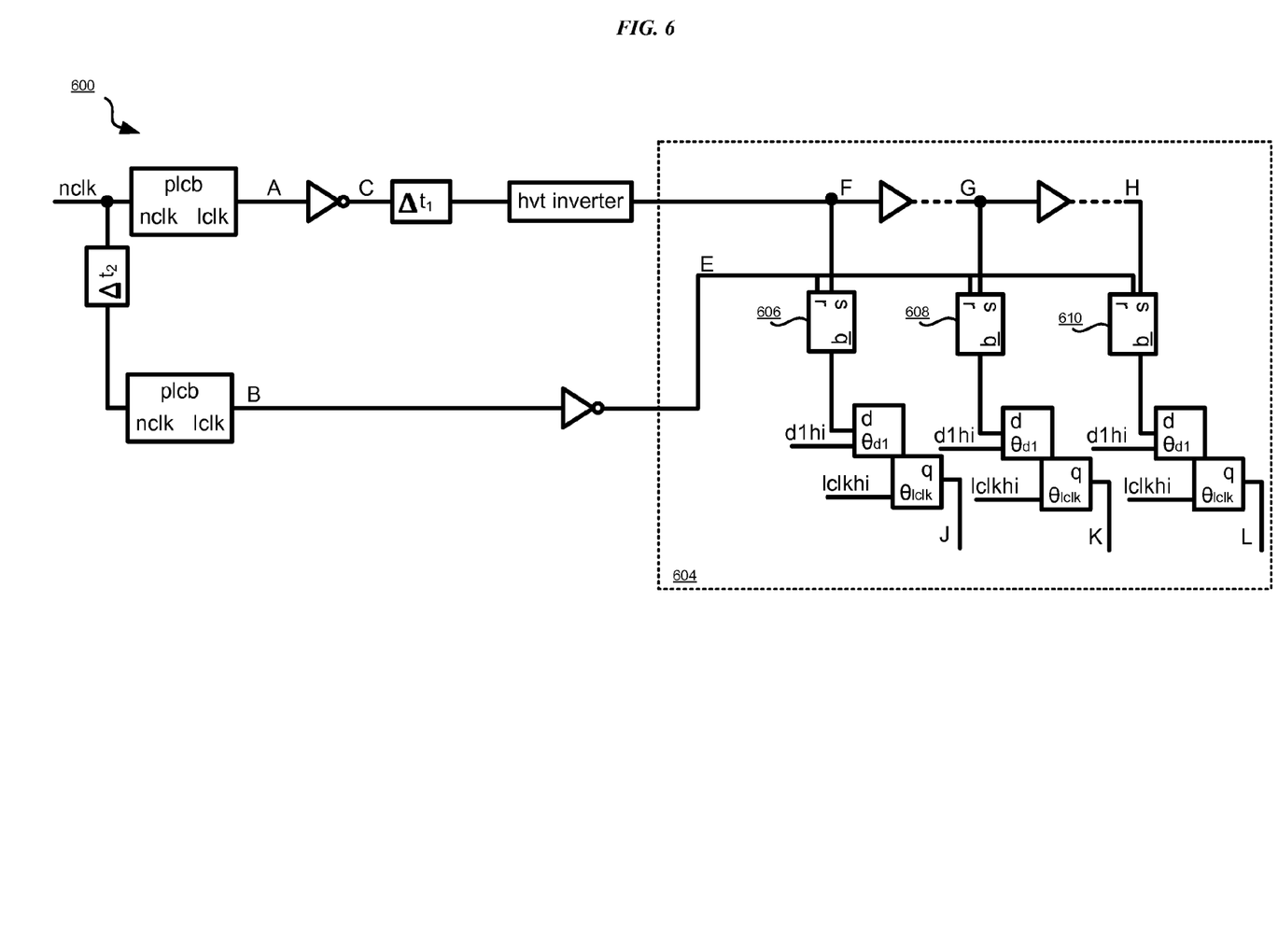
FIG. 6 depicts a circuit diagram of another configuration to increase the maximum sampling frequency of a CPM in accordance with an illustrative embodiment.

With reference to FIG. 6, this figure depicts a circuit diagram of another configuration to increase the maximum sampling frequency of a CPM in accordance with an illustrative embodiment. Circuit 604 replaces circuit 404 to improve a CPM's clock frequency.

In this configuration, each stage of the delay line F-through-H gets an SR latch. SR latch 606 is placed with the edge detector latch in stage F, SR latch 608 is placed with the edge detector latch in stage G, SR latch 610 is placed with the edge detector latch in stage H, and so on, for as many stages as may be present in a given delay line.

In such a configuration in circuit 604, reset signal E does not have to face the propagation delay through delay line F-H as does signal A. Thus, this configuration alleviates the problem recognized in circuit 404 where delay signal E itself faced a propagation delay, limiting the maximum frequency of lclk.

In circuit 606, delay signal E occurs in an offset synchronization with lclk, and lclk signal can be increased beyond the present maximum frequency of circuit 404. Offset synchronization is a manner of synchronizing two signals such that the two signals occur with the same frequency but rise and fall at a constant distance in time (offset in time, or time-shifted, or the rising edge and the falling edge of one signal follow the rising edge and the falling edge, respectively, of the other signal with a constant delay).

At some higher frequency beyond the present maximum frequency of circuit 404, the latter stages in the delay line, e.g. stage H, could see its edge detector latch, e.g., latch L, reset before that stage sees the delayed signal. In such a case, the latter stage or stages can begin to see a data loss. In some implementations, the data loss in higher resolution stages might be an acceptable trade-off for higher than present maximum sampling frequency operation of circuit 604. This embodiment preserves the very low-frequency operation of the original embodiment.

Figure 7:
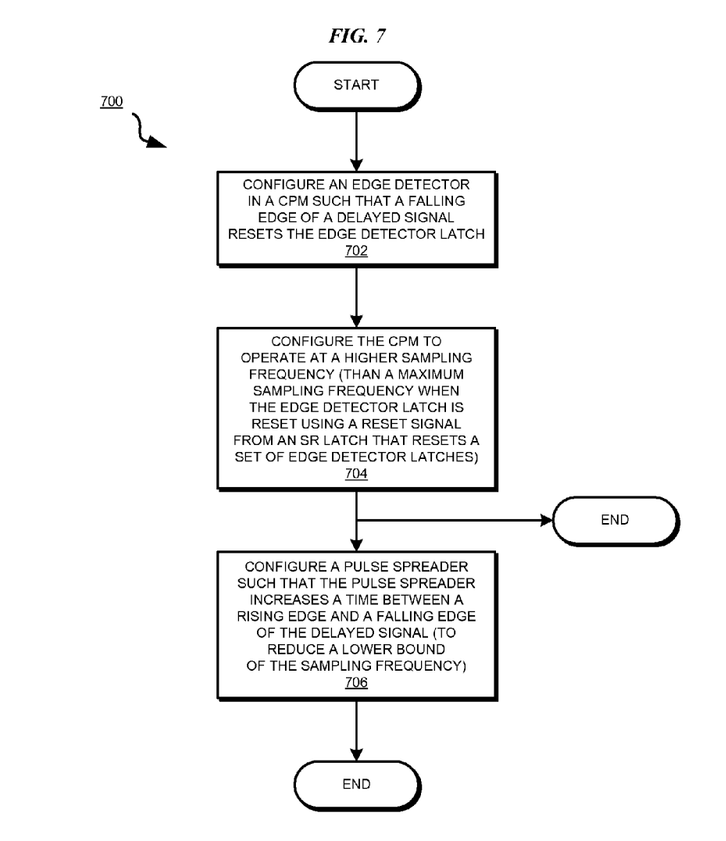
FIG. 7 depicts a flowchart of an example process for extending a clock frequency range of a critical path monitor in accordance with an illustrative embodiment.

With reference to FIG. 7, this figure depicts a flowchart of an example process for extending a clock frequency range of a critical path monitor in accordance with an illustrative embodiment. Process 700 can be implemented in an IC fabrication process to fabricate an improved CPM on the die of an IC, such as to fabricate circuit 504 of FIG. 5.

Process 700 configures an edge detector in a CPM such that a falling edge of a delayed signal resets the edge detector latch (block 702). For example, with reference to FIG. 5, the edge detector of block 702 can be any of edge detector latches J, K, or L in circuit 504, and the delayed signal is delayed signal A at points F, G, and H, respectively in circuit 504.

Process 700 configures the CPM to operate at a higher sampling frequency than a maximum sampling frequency when the edge detector latch is reset using a reset signal from an SR latch that resets a set of edge detectors (block 704). Process 700 ends thereafter. The maximum sampling frequency of block 704 is the present maximum frequency of operating a circuit analogous to circuit 404 in FIG. 4. The configuration where an SR latch resets a set of edge detectors is a configuration similar to the configuration depicted in circuit 404.

In one embodiment, process 700 continues from block 704 to configure a pulse spreader in the CPM, where the pulse spreader increases a time between the rising edge and the falling edge of the delayed signal (block 706). Process 700 ends thereafter. The pulse spreader, operating in this manner, allows the CPM to reduce a lower bound for the sampling frequency in the CPM.

Figure 8:
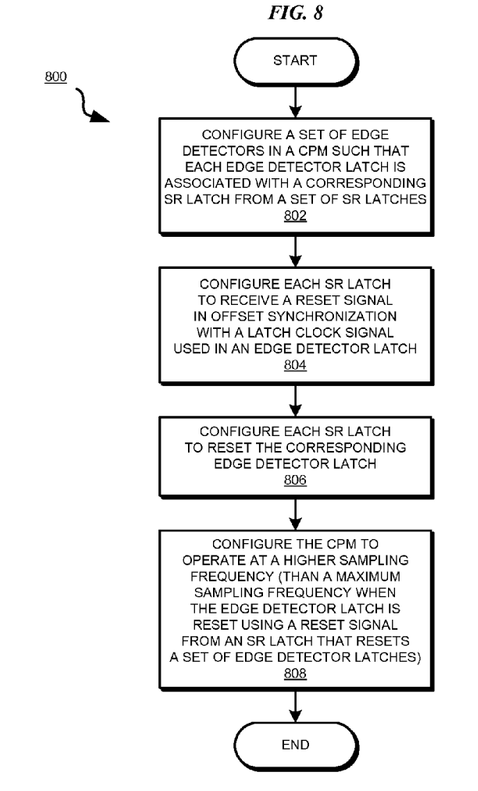
FIG. 8 depicts a flowchart of another example process for extending a clock frequency range of a critical path monitor in accordance with an illustrative embodiment.

With reference to FIG. 8, this figure depicts a flowchart of another example process for extending a clock frequency range of a critical path monitor in accordance with an illustrative embodiment. Process 800 can be implemented in an IC fabrication process to fabricate an improved CPM on the die of an IC, such as to fabricate circuit 604 of FIG. 6.

Process 800 configures a set of edge detectors in a CPM such that each edge detector is associated with a corresponding SR latch from a set of SR latches (block 802). For example, with reference to FIG. 6, the set of edge detectors of block 802 includes SR latches 606, 608, and 610, associated with edge detector latches J, K, and L, respectively, in circuit 604.

Process 800 configures each SR latch to receive a reset signal in synchronization with a latch clock signal used in an edge detector latch (block 804). The reset signal of block 804 does not incur the delays from a delay line where the set of edge detectors are operating, e.g., as depicted in circuit 604 in FIG. 6.

Process 800 configures each SR latch to reset the corresponding edge detector latch (block 806). For example, as depicted in circuit 604, SR latch 606 resets edge detector latch J, SR latch 608 resets edge detector latch K, and SR latch 610 resets edge detector latch L.

Process 800 configures the CPM to operate at a higher sampling frequency than a maximum sampling frequency when the set of edge detector latches is reset using a reset signal from a single SR latch (block 708). Process 700 ends thereafter. The maximum sampling frequency of block 704 is the present maximum frequency of operating a circuit analogous to circuit 404 in FIG. 4. The configuration where an SR latch resets a set of edge detectors is a configuration similar to the configuration depicted in circuit 404.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Thus, a computer implemented method, system, and computer program product are provided in the illustrative embodiments for extending a clock frequency range of a critical path monitor.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable storage device(s) or computer readable media having computer readable program code embodied thereon.

Any combination of one or more computer readable storage device(s) or computer readable media may be utilized. The computer readable medium may be a computer readable storage medium. A computer readable storage device may be, for example, but not limited to, an electronic, magnetic, optical, electromagnetic, or semiconductor system, apparatus, or device, or any suitable combination of the foregoing. More specific examples (a non-exhaustive list) of the computer readable storage device would include the following: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible device or medium that can store a program for use by or in connection with an instruction execution system, apparatus, or device. The term "computer readable storage device," or variations thereof, does not encompass a signal propagation media such as a copper cable, optical fiber or wireless transmission media.

Program code embodied on a computer readable storage device or computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to one or more processors of one or more general purpose computers, special purpose computers, or other programmable data processing apparatuses to produce a machine, such that the instructions, which execute via the one or more processors of the computers or other programmable data processing apparatuses, create means for implementing the functions/acts specified in the flowchart and/or block diagram block or blocks.

These computer program instructions may also be stored in one or more computer readable storage devices or computer readable media that can direct one or more computers, one or more other programmable data processing apparatuses, or one or more other devices to function in a particular manner, such that the instructions stored in the one or more computer readable storage devices or computer readable medium produce an article of manufacture including instructions which implement the function/act specified in the flowchart and/or block diagram block or blocks.

The computer program instructions may also be loaded onto one or more computers, one or more other programmable data processing apparatuses, or one or more other devices to cause a series of operational steps to be performed on the one or more computers, one or more other programmable data processing apparatuses, or one or more other devices to produce a computer implemented process such that the instructions which execute on the one or more computers, one or more other programmable data processing apparatuses, or one or more other devices provide processes for implementing the functions/acts specified in the flowchart and/or block diagram block or blocks.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method for extending a clock frequency range of a critical path monitor (CPM), the method comprising:
    configuring, in an integrated circuit (IC), the CPM, wherein the IC includes a set of critical paths, wherein the CPM includes a set of split paths, a split path in the set of split paths corresponding to a critical path in the set of critical paths, and a split path in the set of split paths including an edge detector;
    configuring the edge detector with a set of edge detector latches;
    configuring a set of set-reset (SR) latches, wherein an edge detector latch in the set of edge detector latches is associated with a corresponding SR latch in the set of SR latches;
    configuring a reset signal to reach the set of edge detector latches in an offset synchronization with a latch clock signal used in the set of edge detector latches; and
    configuring the CPM to operate using a frequency of the latch clock signal such that the frequency is higher than a threshold frequency.

2. The method of claim 1, wherein the threshold frequency is a maximum frequency of the latch clock signal when each edge detector latch is reset using a single SR latch, and wherein a second reset signal sent from the single SR latch passes through a delay-line stage before reaching an edge detector latch in the set of edge detector latches.

3. The method of claim 1, further comprising:
    configuring the reset signal to reset each SR latch in the set of SR latches; and
    configuring each SR latch to reset the corresponding edge detector latch in the set of edge detector latches responsive to the reset signal.

4. The method of claim 1, further comprising:
    configuring the reset signal to avoid a delay associated with a delay-line stage before reaching an edge detector latch in the set of edge detector latches.

5. The method of claim 1, further comprising:
    configuring sending a signal through the split path, wherein the signal is delayed by a first amount of time in a first portion of the split path, wherein the signal is further delayed reaching each edge detector latch in the set of edge detector latches by a different second amount of time;
    configuring each edge detector latch in the set of edge detector latches to capture the signal when the signal arrives at the edge detector latch.

6. The method of claim 1, wherein a number of edge detector latches in the set of edge detector latches corresponds to a resolution of a measurement of a delay in the split path.

7. A computer usable program product comprising a computer usable storage device including computer usable code for extending a clock frequency range of a critical path monitor (CPM), the computer usable code comprising:
    computer usable code for configuring, in an integrated circuit (IC), the CPM, wherein the IC includes a set of critical paths, wherein the CPM includes a set of split paths, a split path in the set of split paths corresponding to a critical path in the set of critical paths, and a split path in the set of split paths including an edge detector;
    computer usable code for configuring the edge detector with a set of edge detector latches;
    computer usable code for configuring a set of set-reset (SR) latches, wherein an edge detector latch in the set of edge detector latches is associated with a corresponding SR latch in the set of SR latches;
    computer usable code for configuring a reset signal to reach the set of edge detector latches in an offset synchronization with a latch clock signal used in the set of edge detector latches; and
    computer usable code for configuring the CPM to operate using a frequency of the latch clock signal such that the frequency is higher than a threshold frequency.

8. The computer usable program product of claim 7, wherein the threshold frequency is a maximum frequency of the latch clock signal when each edge detector latch is reset using a single SR latch, and wherein a second reset signal sent from the single SR latch passes through a delay-line stage before reaching an edge detector latch in the set of edge detector latches.

9. The computer usable program product of claim 7, further comprising:
    computer usable code for configuring the reset signal to reset each SR latch in the set of SR latches; and
    computer usable code for configuring each SR latch to reset the corresponding edge detector latch in the set of edge detector latches responsive to the reset signal.

10. The computer usable program product of claim 7, further comprising:
    computer usable code for configuring the reset signal to avoid a delay associated with a delay-line stage before reaching an edge detector latch in the set of edge detector latches.

11. The computer usable program product of claim 7, further comprising:
    computer usable code for configuring sending a signal through the split path, wherein the signal is delayed by a first amount of time in a first portion of the split path, wherein the signal is further delayed reaching each edge detector latch in the set of edge detector latches by a different second amount of time;
    computer usable code for configuring each edge detector latch in the set of edge detector latches to capture the signal when the signal arrives at the edge detector latch.

12. The computer usable program product of claim 7, wherein a number of edge detector latches in the set of edge detector latches corresponds to a resolution of a measurement of a delay in the split path.

13. The computer usable program product of claim 7, wherein the computer usable code is stored in a computer readable storage medium in a data processing system, and wherein the computer usable code is transferred over a network from a remote data processing system.

14. The computer usable program product of claim 7, wherein the computer usable code is stored in a computer readable storage medium in a server data processing system, and wherein the computer usable code is downloaded over a network to a remote data processing system for use in a computer readable storage medium associated with the remote data processing system.

15. A method for extending a clock frequency range of a critical path monitor (CPM), the method comprising:

configuring, in an integrated circuit (IC), the CPM, wherein the IC includes a set of critical paths, wherein the CPM includes a set of split paths, a split path in the set of split paths corresponding to a critical path in the set of critical paths, and a split path in the set of split paths including an edge detector;

configuring the edge detector with a set of edge detector latches;

configuring sending a signal through the split path, wherein the signal is delayed by a first amount of time in a first portion of the split path, wherein the signal is further delayed reaching each edge detector latch in the set of edge detector latches by a different second amount of time;

configuring each edge detector latch in the set of edge detector latches to capture the signal when a rising edge of the signal arrives at the edge detector latch; and configuring each edge detector latch in the set of edge detector latches to reset when a falling edge of the signal arrives at the edge detector latch.

* * * * *